(12) United States Patent
Kim et al.

(10) Patent No.: US 11,749,702 B2
(45) Date of Patent: Sep. 5, 2023

(54) IMAGE SENSOR

(71) Applicant: Samsung Electronics Co., Ltd., Suwon-si (KR)

(72) Inventors: Sang-Hoon Kim, Seongnam-si (KR); Min-Geun Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 269 days.

(21) Appl. No.: 17/222,514

(22) Filed: Apr. 5, 2021

(65) Prior Publication Data
US 2022/0020804 A1 Jan. 20, 2022

(30) Foreign Application Priority Data

Jul. 14, 2020 (KR) .................. 10-2020-0087054

(51) Int. Cl.
*H01L 27/146* (2006.01)
*H01L 23/00* (2006.01)

(52) U.S. Cl.
CPC ........ *H01L 27/14636* (2013.01); *H01L 24/05* (2013.01); *H01L 27/14623* (2013.01);
(Continued)

(58) Field of Classification Search
CPC ............... H01L 27/14636; H01L 24/05; H01L 27/14623; H01L 27/14685; H01L 24/06; H01L 27/14621; H01L 27/14634; H01L 2224/05025; H01L 2224/05082; H01L 2224/05184; H01L 2224/05186; H01L 2224/05624; H01L 2224/06181; H01L 24/08; H01L 2224/05554; H01L 2224/05571; H01L 27/14689; H01L 27/1469; H01L 27/1464; H01L 27/14643;
(Continued)

(56) References Cited

U.S. PATENT DOCUMENTS 6,809,008 B1 * 10/2004 Holm .................... H01L 23/481
438/455
9,520,435 B2 * 12/2016 Ahmed ............... H01L 27/1462
(Continued)

FOREIGN PATENT DOCUMENTS

| JP | 2015023259 A | 2/2015 |
|---|---|---|
| JP | 2018117027 A | 7/2018 |
| JP | 2020027884 A | 2/2020 |
| KR | 1020110126891 A | 11/2011 |
| KR | 1020160044879 A | 4/2016 |

*Primary Examiner* — Jonathan Han
(74) *Attorney, Agent, or Firm* — Muir Patent Law, PLLC

(57) ABSTRACT

An image sensor includes a substrate including a pixel region and a pad region and having a first surface and a second surface opposite to the first surface, the pad region of the substrate being provided with a first recess which is recessed to a first depth from the second surface toward the first surface and the pixel region of the substrate being provided with a plurality of unit pixels, an interlayer insulating layer disposed on the first surface, an interconnection line disposed in the interlayer insulating layer, a conductive pad disposed in the first recess of the pad region, and a plurality of penetration structures disposed in the pad region of the substrate and extending from a bottom surface of the first recess to the first surface of the substrate, and electrically connecting the conductive pad to the interconnection line.

20 Claims, 16 Drawing Sheets

(52) U.S. Cl.
CPC ........ *H01L 27/14685* (2013.01); *H01L 24/06* (2013.01); *H01L 27/14621* (2013.01); *H01L 27/14634* (2013.01); *H01L 2224/05025* (2013.01); *H01L 2224/05082* (2013.01); *H01L 2224/05184* (2013.01); *H01L 2224/05186* (2013.01); *H01L 2224/05624* (2013.01); *H01L 2224/06181* (2013.01)

(58) Field of Classification Search
CPC . H01L 2224/08145; H01L 2224/09181; H01L 2224/9202; H01L 27/1463; H01L 27/14683; H01L 27/1462; H01L 27/14698; H01L 2224/05; H01L 2224/48463; H01L 27/14632; H01L 27/14687; H01L 27/14806
See application file for complete search history.

(56) References Cited

U.S. PATENT DOCUMENTS

| | | | |
|---|---|---|---|
| 10,026,769 B2 | 7/2018 | Kagawa et al. | |
| 10,615,200 B2 | 4/2020 | Lee | |
| 2011/0084350 A1* | 4/2011 | Murakoshi | H01L 27/14632 |
| | | | 257/E31.127 |
| 2011/0207258 A1* | 8/2011 | Ahn | H01L 27/1462 |
| | | | 257/E31.127 |
| 2012/0313208 A1* | 12/2012 | Kim | H01L 23/481 |
| | | | 257/435 |
| 2015/0255495 A1* | 9/2015 | Park | H01L 27/14621 |
| | | | 257/446 |
| 2016/0111461 A1 | 4/2016 | Ahn et al. | |
| 2017/0170238 A1* | 6/2017 | Lee | H01L 27/14685 |
| 2017/0301715 A1* | 10/2017 | Cheng | H01L 27/14632 |
| 2020/0021754 A1 | 1/2020 | Borthakur | |

\* cited by examiner

IMAGE SENSOR

CROSS-REFERENCE TO RELATED APPLICATIONS

This U.S. non-provisional patent application claims priority under 35 U.S.C. § 119 to Korean Patent Application No. 10-2020-0087054, filed on Jul. 14, 2020, in the Korean Intellectual Property Office, the entire contents of which are hereby incorporated by reference.

BACKGROUND OF THE INVENTION

The present disclosure relates to an image sensor.

An image sensor is a semiconductor device converting an optical image to electric signals. Image sensors are classified into two types: a charge coupled device (CCD) type and a complementary metal-oxide-semiconductor (CMOS) type. The CMOS-type image sensor is called CIS for short. The CIS includes a plurality of pixels that are two-dimensionally arranged. Each of the pixels includes a photodiode (PD). The photodiode is used to convert an incident light to an electric signal.

SUMMARY

An embodiment of the inventive concept provides an image sensor capable of realizing a clear image.

According to an embodiment of the present invention, an image sensor includes a substrate including a pixel region and a pad region and having a first surface and a second surface opposite to the first surface, the pad region of the substrate being provided with a first recess which is recessed to a first depth from the second surface toward the first surface and the pixel region of the substrate being provided with a plurality of unit pixels, an interlayer insulating layer disposed on the first surface, an interconnection line disposed in the interlayer insulating layer, a conductive pad disposed in the first recess of the pad region, and a plurality of penetration structures disposed in the pad region of the substrate and extending from a bottom surface of the first recess to the first surface of the substrate, and electrically connecting the conductive pad to the interconnection line.

According to an embodiment of the present invention, an image sensor includes a substrate including a pixel region and a pad region and having a first surface and a second surface opposite to the first surface, the pad region of the substrate being provided with a first recess which is recessed to a first depth from the second surface toward the first surface and the pixel region being provided with a plurality of unit pixels, a deep device isolation structure disposed in the pixel region of the substrate to separate the plurality of unit pixels from each other, each of the plurality of unit pixels including a photoelectric conversion part disposed in the substrate and a transfer gate disposed on the first surface of the substrate, an interlayer insulating layer disposed on the first surface of the substrate, an interconnection line disposed in the interlayer insulating layer, a conductive pad disposed in the first recess of the pad region of the substrate, and a plurality of penetration structures disposed in the pad region of the substrate, the plurality of penetration structures extending from a bottom surface of the first recess to the first surface of the substrate, overlapped with the conductive pad, and electrically connecting the conductive pad to the interconnection line. The deep device isolation structure has a first width, each of the plurality of penetration structures has a second width, and the second width is 1.0-2.0 times the first width.

According to an embodiment of the present invention, an image sensor includes a substrate including a pixel region and a pad region and having a first surface and a second surface opposite to the first surface, the pad region of the substrate being provided with a first recess which is recessed to a first depth from the second surface toward the first surface and the pixel region of the substrate being provided with a plurality of unit pixels, a deep device isolation structure disposed in the pixel region of the substrate to separate the plurality of unit pixels from each other, an interlayer insulating layer disposed on the first surface, an interconnection line disposed in the interlayer insulating layer, a conductive pad disposed in the first recess of the pad region, and a plurality of penetration structures disposed in the pad region of the substrate. The plurality of penetration structures extend from a bottom surface of the first recess to the first surface of the substrate, are overlapped with the conductive pad, and electrically connect the conductive pad to the interconnection line. The deep device isolation structure has a first height, each of the plurality of penetration structures has a second height, and the second height is smaller than the first height.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
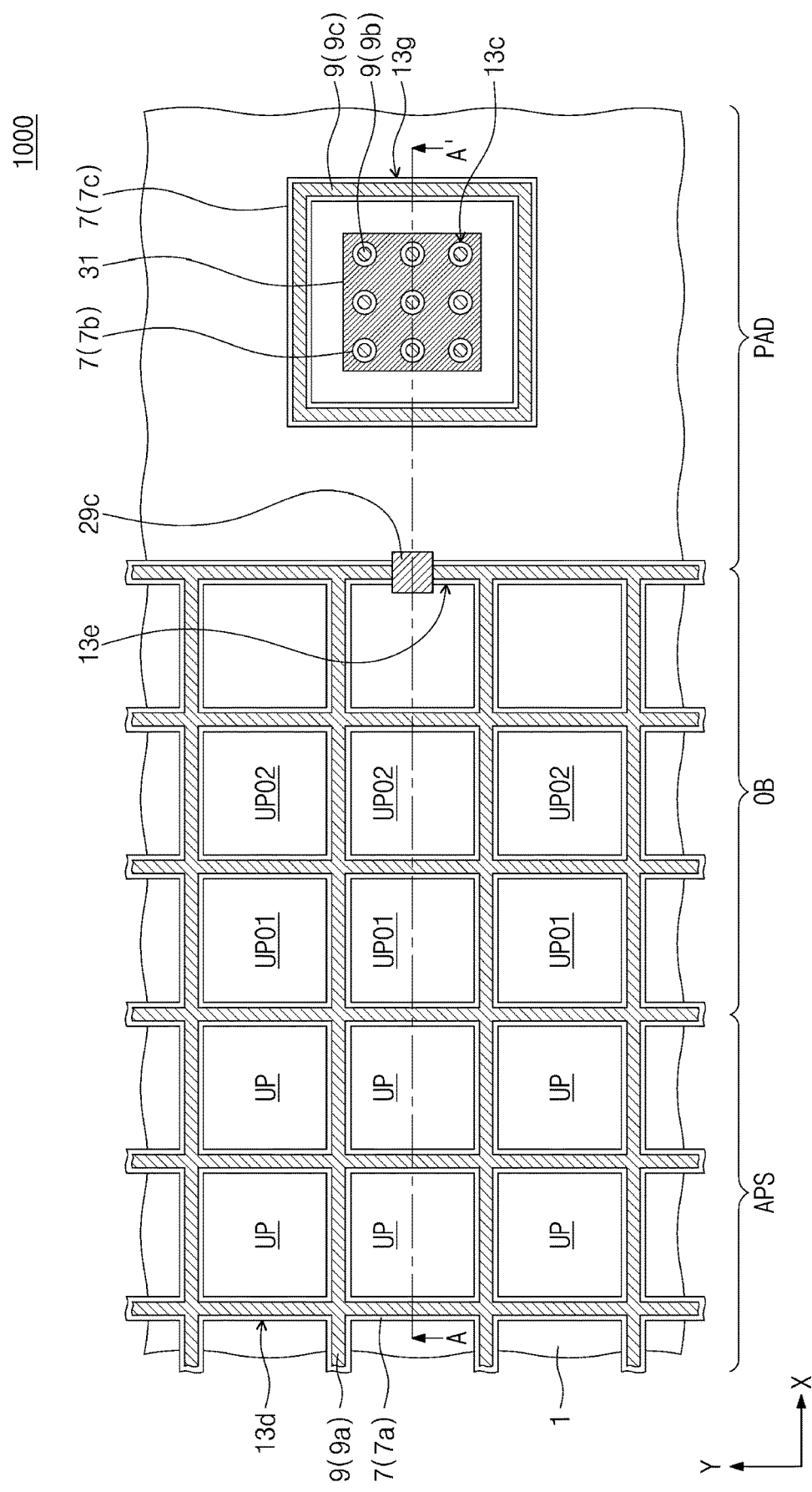
FIG. 1 is a plan view illustrating a semiconductor device according to an embodiment of the inventive concept.
Figure 2:
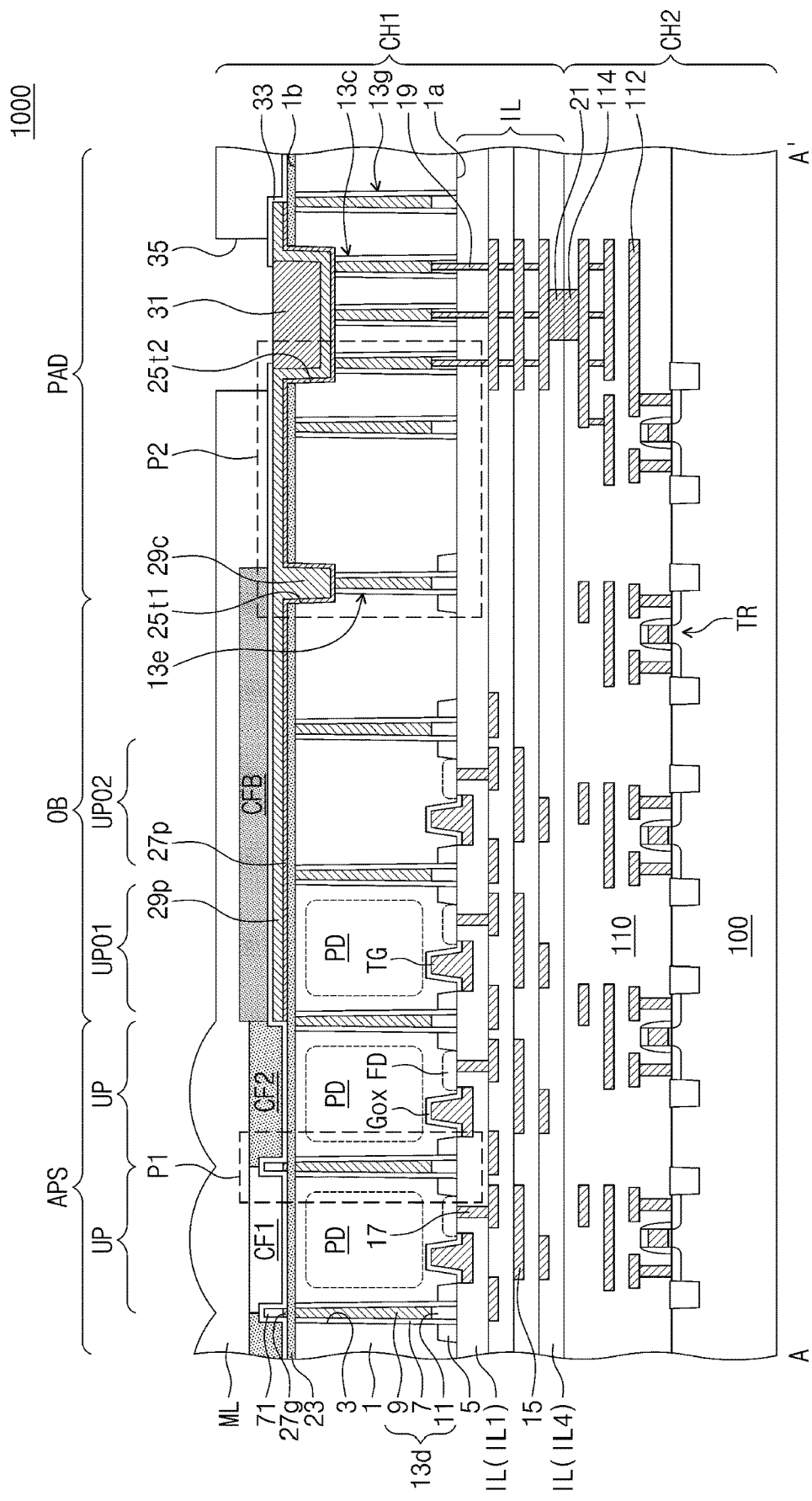
FIG. 2 is a sectional view taken along line A-A' of FIG. 1 to illustrate a semiconductor device according to an embodiment of the inventive concept.

FIG. 1 is a plan view illustrating a semiconductor device according to an embodiment of the inventive concept. FIG. 2 is a sectional view taken along line A-A' of FIG. 1 to illustrate a semiconductor device according to an embodiment of the inventive concept.

Referring to FIGS. 1 and 2, an image sensor 1000 according to an embodiment of the inventive concept may have a structure, in which a first sub-chip CH1 and a second sub-chip CH2 are bonded to each other. In an embodiment, the first sub-chip CH1 may be configured to have an image sensing function. The second sub-chip CH2 may include circuits, which are used to operate the first sub-chip CH1 or to store electrical signals processed by the first sub-chip CH1.

The first sub-chip CH1 may include a first substrate 1 including a pad region PAD, an optical black region OB, and a pixel region APS. The first substrate 1 may include a first surface 1a and a second surface 1b, which are opposite to each other. The first substrate 1 may be, for example, a single-crystalline silicon wafer, a silicon epitaxial layer, or a silicon-on-insulator (SOI) wafer. The first substrate 1 may be doped to have, for example, a first conductivity type. For example, the first conductivity type may be a p type.

The pixel region APS may include a plurality of unit pixels UP. A deep device isolation portion 13d (i.e., a deep device isolation structure) may be disposed in the pixel region APS of the first substrate 1 to separate the unit pixels UP from each other. A shallow device isolation portion 5 (i.e., a shallow device isolation structure) may be disposed in the first substrate 1 and adjacent to the first surface 1a. The deep device isolation portion 13d may penetrate the shallow device isolation portion 5.

A photoelectric conversion part PD may be disposed in each of the unit pixels UP of the first substrate 1. The photoelectric conversion part PD may also be disposed in the optical black region OB of the first substrate 1. The photoelectric conversion part PD may be doped to have, for example, a second conductivity type that is different from the first conductivity type. The second conductivity type may be, for example, an n type. The photoelectric conversion part PD of the n type and the first substrate 1 of the p type may form a pn junction serving as a photo diode.

In each unit pixel UP, a transfer gate TG may be disposed on the first surface 1a of the first substrate 1. A portion of the transfer gate TG may be extended into the first substrate 1. The transfer gate TG may be of a vertical type. Alternatively, the transfer gate TG may be of a planar type. In an embodiment, the transfer gate TG with a flat shape is not extended into the first substrate 1. A gate insulating layer Gox may be interposed between the transfer gate TG and the first substrate 1. A floating diffusion region FD may be formed in a portion of the first substrate 1, which is located at a side of the transfer gate TG. The floating diffusion region FD may be doped to have, for example, the second conductivity type. Each unit pixel UP may include the photoelectric conversion part PD, the floating diffusion region FD, and the transfer gate TG. Each unit pixel UP may further include a reset gate, a reset drain, and an output unit. In an embodiment, each unit pixel UP may be disposed between two adjacent deep device isolation portions 13d.

Light may be incident on the first substrate 1 through the second surface 1b of the first substrate 1. Electron-hole pairs may be produced in the pn junction by the incident light. The electrons produced by this process may be moved to the photoelectric conversion part PD. If the transfer gate TG is applied with a voltage (i.e., the transfer gate TG turns on), the transfer gate TG may form a channel region at the boundary between the transfer gate TG and the first substrate 1 so that the electrons may be transferred from the photoelectric conversion part PD to the floating diffusion region FD via the channel region.

The first surface 1a may be covered with a plurality of first interlayer insulating layers IL. Each of the first interlayer insulating layers IL may be formed of at least one of silicon oxide, silicon nitride, silicon oxynitride, and a low-k dielectric material. For example, the interlayer insulating layers IL may be formed of four interlayer insulating layers including the lowermost first interlayer insulating layer IL1 and the uppermost first interlayer insulating layer IL4. The present invention is not limited thereto. In an embodiment, the interlayer insulating layers IL are formed of two, three, or more than four insulating layers. First interconnection lines 15 may be formed between or in the first interlayer insulating layers IL. The floating diffusion region FD may be connected to the first interconnection line 15 through a first contact plug 17. In the pixel region APS, the first contact plug 17 may penetrate the lowermost first interlayer insulating layer ILL which is closest to the first surface 1a among the first interlayer insulating layers IL. Front-side conductive pads 21, which is connected to the first interconnection lines 15, may be disposed in the uppermost first interlayer insulating layer IL4, which is farthest from the first surface 1a among the first interlayer insulating layers IL. The front-side conductive pad 21 may be formed of or include, for example, copper.

In the optical black region OB, the light is not incident on the first substrate 1. In the optical black region OB, the deep device isolation portion 13d may be extended to separate a first black pixel UPO1 from a second black pixel UPO2. The photoelectric conversion part PD may be disposed in the first black pixel UPO1 of the first substrate 1. The photoelectric conversion part PD does not exist in the second black pixel UPO2 of the first substrate 1. The transfer gate TG and the floating diffusion region FD may be disposed in both the first and second black pixels UPO1 and UPO2. The first black pixel UPO1 may be used to sense an amount of charges, which are produced from the photoelectric conversion part PD when light is blocked, and thereby to set a first reference charge amount. The first reference charge amount may be used as a reference value for comparison with an amount of charges produced in each of the unit pixels UP. The second black pixel UPO2 may be used to sense an amount of charges, which are produced when the photoelectric conversion part PD is absent, and thereby to set a second reference charge amount. The second reference charge amount may be used as data to remove a process noise.

Although not shown, reset transistors, selection transistors, and source follower transistors may be disposed on the first surface 1a of the first substrate 1. The image sensor 1000 may be a back-side light-receiving image sensor.

The second surface 1b of the first substrate 1 may be covered with a fixed charge layer 23. Although not shown, an anti-reflection layer may be disposed on the fixed charge layer 23. The fixed charge layer 23 may be formed of metal oxide layer, whose oxygen content is lower than its stoichiometric ratio, or a metal fluoride layer, whose fluorine content ratio is lower than its stoichiometric ratio. Accordingly, the fixed charge layer 23 may have a plurality of negative fixed charges. The fixed charge layer 23 may be formed of metal oxide or metal fluoride containing at least one metal, which is selected from the group consisting of hafnium (Hf), zirconium (Zr), aluminum (Al), tantalum (Ta), titanium (Ti), yttrium (Y), and lanthanoid. In this case, hole accumulation may occur near the fixed charge layer 23.

Thus, it may be possible to effectively prevent or suppress dark current and white spot issues from occurring. In an embodiment, the fixed charge layer 23 may be formed of or include at least one of aluminum oxide and hafnium oxide. The fixed charge layer 23 may be in contact with the second surface 1b of the first substrate 1. The fixed charge layer 23 may be disposed to surround the photoelectric conversion part PD. As the fixed charge layer 23 has the negatively fixed charges, a hole accumulation may occur around the second surface 1b of the first substrate 1 contacting the fixed charge layer 23. As such, electrons generated under the dark state, i.e., dark current, may move into holes to combine therewith such that a likelihood of a dark current may be reduced. Consequently, this may reduce the likelihood of the occurrence of a white spot. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A first recess 25t1 is formed by etching the fixed charge layer 23 and a portion of the first substrate 1. For example, the first recess 25t1 may be formed at a boundary between the optical black region OB of the first substrate 1 and the pad region PAD of the first substrate 1. A side surface of the first recess 25t1 may be aligned with a side surface of the fixed charge layer 23. The first recess 25t1 may expose a deep device isolation portion 13e, which is placed at the outermost region, among the deep device isolation portions 13d. In an embodiment, the first recess 25t1, when the image sensor 1000 is viewed in a plan view, is of a quadrilateral shape such as a square or rectangle.

In the pad region PAD, a second trench 25t2 may be formed by etching the fixed charge layer 23 and a portion of the first substrate 1. A side surface of the second trench 25t2 may be aligned to the side surface of the fixed charge layer 23. The second trench 25t2 may be spaced apart from the first recess 25t1. Below the second trench 25t2, a plurality of penetration structures 13c may penetrate the first substrate 1.

In the pad region PAD, a pad isolation portion 13g (i.e., a pad isolation structure) may penetrate the first substrate 1. The pad isolation portion 13g may be spaced apart from the second trench 25t2. When viewed in a plan view, the pad isolation portion 13g may enclose the plurality of the penetration structures 13c. For example, when the image sensor 1000 is viewed in a plan view, the pad isolation portion 13g is a closed-loop pad isolation structure, and the plurality of the penetration structure 13 is disposed the inside of the closed-loop pad isolation structure.

In the optical black region OB and the pad region PAD, a diffusion prevention pattern 27p and a first optical black pattern 29p may be disposed on the fixed charge layer 23. Each of the diffusion prevention pattern 27p and the first optical black pattern 29p may be formed of or include at least one of conductive materials. The diffusion prevention pattern 27p may conformally cover the first recess 25t1 and the second trench 25t2. The diffusion prevention pattern 27p may be formed of or include at least one of metal nitrides (e.g., TiN, TaN, and WN). The first optical black pattern 29p may be formed of or include, for example, tungsten. The first optical black pattern 29p may include a bias contact plug 29c filling the first recess 25t1. The bias contact plug 29c may be electrically connected to the deep device isolation portion 13d.

The first optical black pattern 29p may conformally cover the second trench 25t2. A back-side conductive pad 31 may be disposed in the second trench 25t2. The back-side conductive pad 31 may be formed of or include a material different from the first optical black pattern 29p. For example, the back-side conductive pad 31 may be formed of or include aluminum.

In the pixel region APS, a light-blocking grid pattern 27g may be disposed on the fixed charge layer 23. The light-blocking grid pattern 27g may be overlapped with the deep device isolation portion 13d and may have a mesh structure, when viewed in a plan view. A low refractive pattern 71 may be disposed on the light-blocking grid pattern 27g. The low refractive pattern 71 may be formed of or include at least one of organic materials. The low refractive pattern 71 may have a refractive index lower than color filters CF1 and CF2. For example, the low refractive pattern 71 may have a refractive index of about 1.3 or lower. The low refractive pattern 71 may be overlapped with the light-blocking grid pattern 27g and may have the same planar shape as the light-blocking grid pattern 27g. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The pixel region APS, the optical black region OB, and the pad region PAD may be covered with a passivation layer 33. The passivation layer 33 may be formed of or include, for example, silicon nitride. The passivation layer 33 may expose the back-side conductive pad 31.

The color filters CF1 and CF2 may be disposed on the pixel region APS and between the low refractive patterns 71. Each of the color filters CF1 and CF2 may have one color of blue, green, and red. In the optical black region OB, a second optical black pattern CFB may be disposed on the passivation layer 33. The second optical black pattern CFB may be formed of or include the same material as, for example, the color filter of blue.

The pixel region APS, the optical black region OB, and the pad region PAD may be covered with a micro lens layer ML. The micro lens layer ML may have a convex lens shape, on each of the unit pixels UP of the pixel region APS. The micro lens layer ML may have a flat top surface, on the optical black region OB and the pad region PAD. The micro lens layer ML may have an opening 35 exposing the back-side conductive pad 31.

The second sub-chip CH2 may include a second substrate 100, a plurality of transistors TR disposed on the second substrate 100, a second interlayer insulating layer 110 covering the second substrate 100, second interconnection lines 112 disposed in the second interlayer insulating layer 110, and a logic conductive pad 114 connected to the topmost one of the second interconnection lines 112. The second interlayer insulating layer 110 may have a single- or multi-layered structure, in which each layer is formed of at least one of silicon oxide, silicon nitride, silicon oxynitride, and a low-k insulating material. The logic conductive pad 114 may be formed of or include, for example, copper. The first sub-chip CH1 may be bonded to the second sub-chip CH2. Accordingly, the uppermost first interlayer insulating layer IL4 may be in contact with the second interlayer insulating layer 110. The front-side conductive pad 21 may be in contact with the logic conductive pad 114.

Figure 3A:
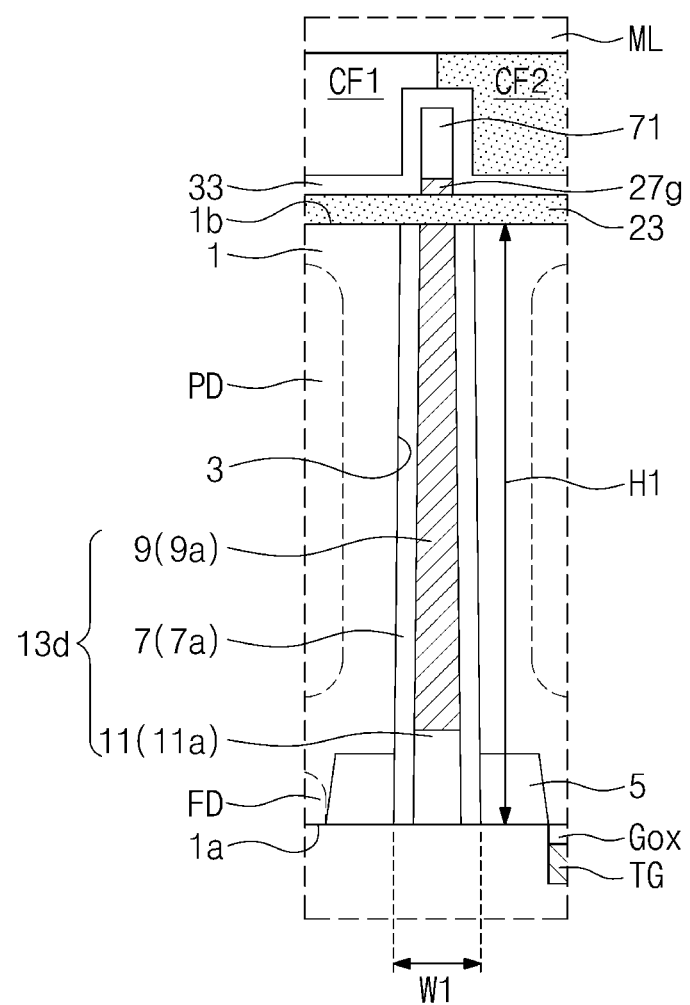
FIG. 3A is an enlarged sectional view illustrating portion 'P1' of FIG. 2.
Figure 3B:
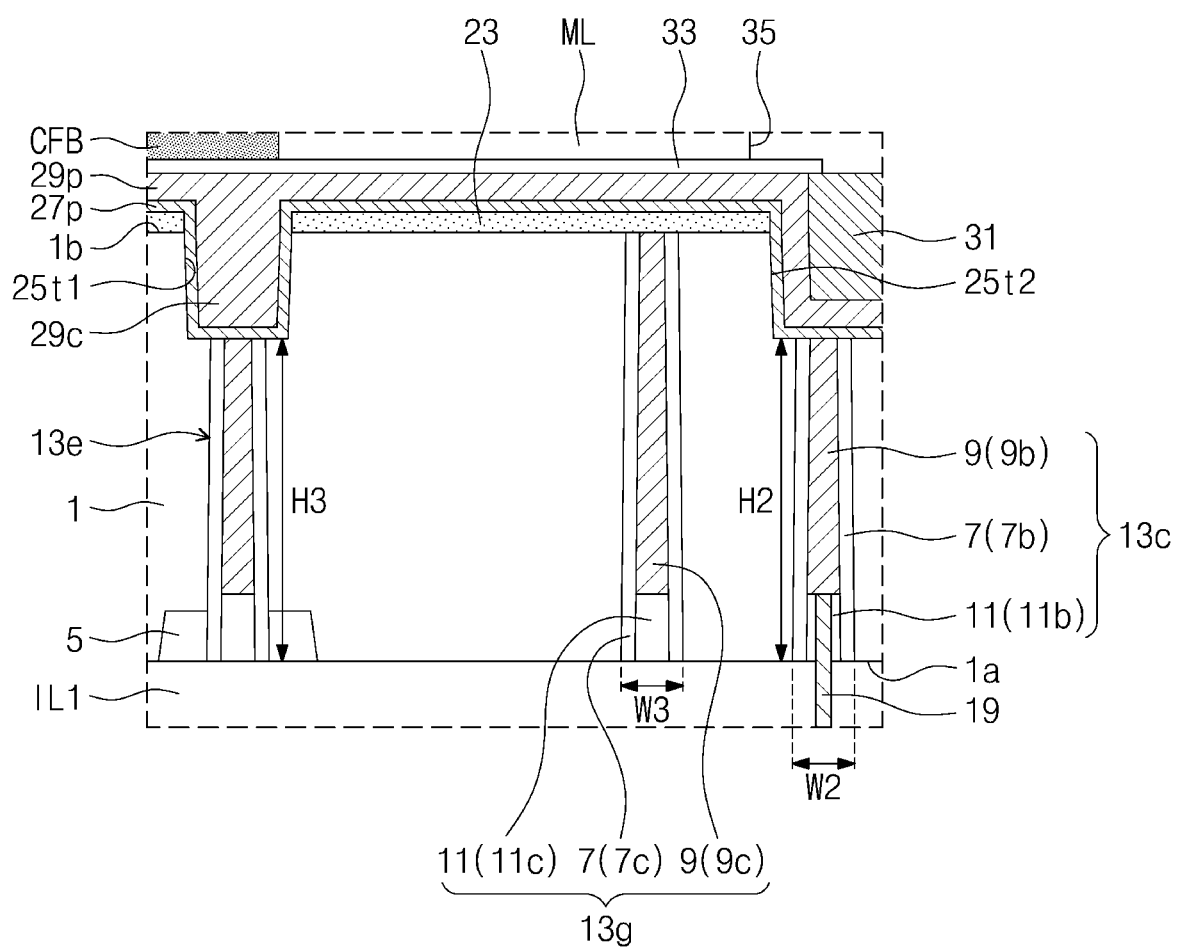
FIG. 3B is an enlarged sectional view illustrating portion 'P2' of FIG. 2.

FIG. 3A is an enlarged sectional view illustrating portion 'P1' of FIG. 2. FIG. 3B is an enlarged sectional view illustrating portion 'P2' of FIG. 2.

Referring to FIGS. 3A and 3B, each of the deep device isolation portion 13d, and the outermost deep device isolation portion 13e may be disposed in the deep trench 3. The pad isolation portion 13g may be disposed in a closed-loop recess which extends from the second surface 1b of the first substrate 1 to the first surface 1a of the first substrate 1, and the penetration structures 13c may be disposed in a plurality of holes which extend from the second surface 1b of the first substrate 1 to the first surface 1a of the first substrate 1. The deep device isolation portion 13d, the outermost deep device isolation portion 13e, the pad isolation portion 13g, and the penetration structures 13c may have bottom surfaces that are coplanar with the first surface 1a of the first substrate 1. The deep device isolation portion 13d, the outermost deep device isolation portion 13e, the pad isolation portion 13g, and the penetration structures 13c may all have the same or similar structure. Each of them may include a conductive pattern 9, an isolation insulating layer 7 enclosing a side surface of the conductive pattern 9, and a gapfill insulating pattern 11 interposed between the conductive pattern 9 and the lowermost first interlayer insulating layer IL1. The deep device isolation portion 13d may include a first conductive pattern 9a, a first gapfill insulating pattern 11a interposed between the first conductive pattern 9a and the lowermost first interlayer insulating layer IL1, and a first isolation insulating layer 7a enclosing side surfaces of the first conductive pattern 9a and the first gapfill insulating pattern 11a. Each of the penetration structures 13c may include a second conductive pattern 9b, a second gapfill insulating pattern 11b interposed between the second conductive pattern 9b and the lowermost first interlayer insulating layer ILL and a second isolation insulating layer 7b enclosing side surfaces of the second conductive pattern 9b and the second gapfill insulating pattern 11b. The pad isolation portion 13g may include a third conductive pattern 9c, a third gapfill insulating pattern 11c interposed between the third conductive pattern 9c and the lowermost first interlayer insulating layer ILL and a third isolation insulating layer 7c enclosing side surfaces of the third conductive pattern 9c and the third gapfill insulating pattern 11c. All of the first to third conductive patterns 9a, 9b, and 9c may be formed of or include the same conductive material (e.g., metal or doped polysilicon). In the case where each of the first to third conductive patterns 9a, 9b, and 9c includes doped polysilicon, the first to third conductive patterns 9a, 9b, and 9c may be the same in the kind of impurities and doping concentration. All of the first to third isolation insulating layers 7a, 7b, and 7c may be formed of or include the same material (e.g., a silicon oxide layer). All of the first to third gapfill insulating patterns 11a, 11b, and 11c may be formed of or include the same material (e.g., a silicon oxide layer). The third conductive pattern 9c of the pad isolation portion 13g is not applied with any voltage and may be in an electrically-floated state.

The deep device isolation portion 13d may have a first width W1 at a specific height from the first surface 1a. Each of the penetration structures 13c may have a second width W2 at the specific height, at which the first width W1 is measured, from the first surface 1a. In an embodiment, the second width W2 may be equal to or larger than the first width W1. As an example, the second width W2 may be 1.0-2.0 times the first width W1.

The deep device isolation portion 13d may have a first height H1 corresponding to a thickness of the first substrate 1. Due to the presence of the second trench 25t2, the penetration structures 13c may have a second height H2 that is smaller than the first height H1. Due to the presence of the first recess 25t1, the outermost deep device isolation portion 13e may have a third height H3 that is smaller than the first height H1. The second height H2 may be equal to or smaller than the third height H3.

Referring to FIGS. 1 and 2, the first conductive pattern 9a of the deep device isolation portion 13d may have a mesh shape and may be in contact with the bias contact plug 29c. In an embodiment, a negative voltage may be applied to the first conductive pattern 9a of the deep device isolation portion 13d through the back-side conductive pad 31 and the bias contact plug 29c. In this case, it may be possible to capture holes on a surface of the deep device isolation portion 13d and thus to improve a dark current property of the image sensor 1000.

In certain embodiments, at other positions of the image sensor 1000, the back-side conductive pad 31 is not connected to the bias contact plug 29c. The second conductive patterns 9b of the penetration structures 13c are not connected to a second contact plug 19.

Referring to FIGS. 2 and 3B, the second contact plug 19 may penetrate the lowermost first interlayer insulating layer IL1 and to connect the second conductive pattern 9b to at least one of the first interconnection lines 15. Accordingly, the back-side conductive pad 31 may be electrically connected to at least one of the first interconnection lines 15 through the plurality of the penetration structures 13c. In an embodiment, a plurality of the penetration structures 13c may be provided, and each of the penetration structures 13c may have the same or similar width as the deep device isolation portion 13d. Accordingly, it may be possible to reduce a process failure and to prevent a physical, mechanical, or thermal stress from being concentrated on a specific region, compared with a structure, in which one through-silicon-via (TSV) or back-vias-stack (BVS) contact plug having a relatively very large width connects the back-side conductive pad 31 to the first interconnection lines 15. Thus, it may be possible to improve reliability of the image sensor.

Figure 4:
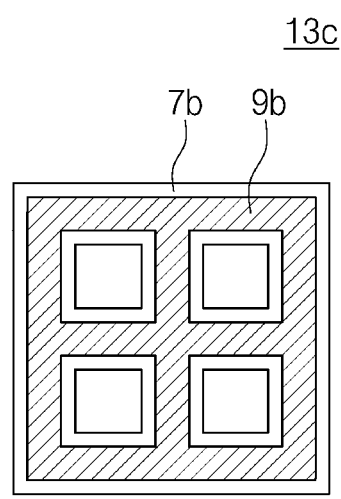
FIG. 4 is a plan view illustrating a planar shape of a penetration structure according to an embodiment of the inventive concept.

FIG. 4 is a plan view illustrating a planar shape of a penetration structure according to an embodiment of the inventive concept.

Referring to FIGS. 1 and 4, the penetration structure 13c may be provided in plural, as shown in FIG. 1 and each of the penetration structures 13c may have an island shape that is isolated from the others. Alternatively, the penetration structure 13c may have a grid shape, in which the isolated penetration structures are connected to each other, as shown in FIG. 4. The shape of the penetration structure 13c is not limited to these examples and may be variously changed.

FIGS. 5A to 5F are sectional views sequentially illustrating a process of fabricating an image sensor, which has a vertical section shown in FIG. 2.

Figure 5A:
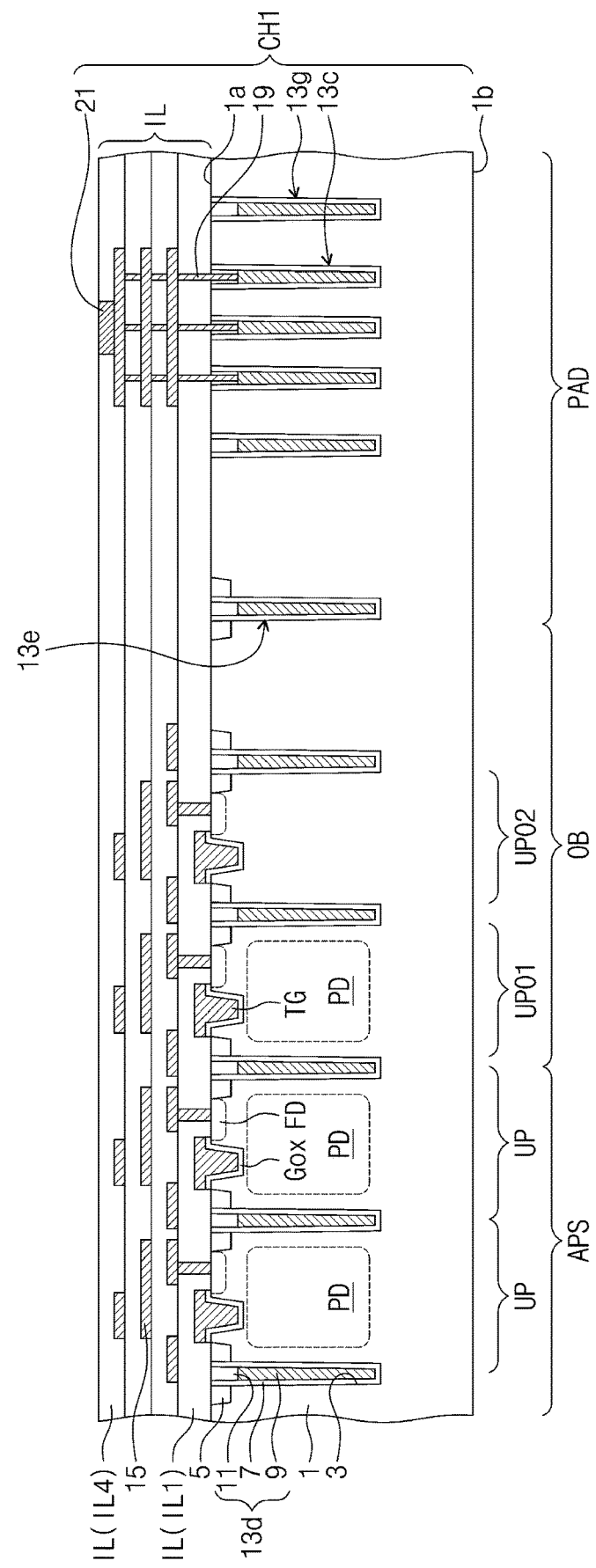
FIGS. 5A to 5F are sectional views sequentially illustrating a process of fabricating an image sensor, which has a vertical section shown in FIG. 2.

Referring to FIG. 5A, the first sub-chip CH1 may be fabricated. For this, an ion implantation process or the like may be performed on the first substrate 1 including the pixel region APS, the optical black region OB, and the pad region PAD to form the photoelectric conversion part PD. The shallow device isolation portion 5 may be formed in the first surface 1a of the first substrate 1 to define active regions. The shallow device isolation portion 5 may be formed by a shallow trench isolation (STI) process. Deep trenches 3 may be formed by etching the shallow device isolation portion 5 and a portion of the first substrate 1. In the pixel region APS and the optical black region OB, the deep trenches 3 may delimit the unit pixels UP and the black pixels UPO1 and UPO2. In the pad region PAD, the deep trenches 3 may delimit positions of the pad isolation portion 13g and the penetration structures 13c. The isolation insulating layer 7 may be conformally formed on the entire region of the first surface 1a of the first substrate 1, a conductive material may be formed to fill the deep trenches 3, and then an etch-back process may be performed to form the conductive patterns 9 in the deep trenches 3, respectively. Next, the gapfill insulating patterns 11 may be formed on the conductive patterns 9, and the isolation insulating layer 7 on the first surface 1a may be removed to expose the first surface 1a. Accordingly, the deep device isolation portion 13d, the outermost deep device isolation portion 13e, the penetration structures 13c, and the pad isolation portion 13g may be formed at the same time. According to an embodiment of the inventive concept, since the penetration structures 13c and the deep device isolation portion 13d are formed at the same time, it may be possible to omit a process of forming TSV or BVS structures and to simplify the fabrication process. The penetration structures 13c may be formed to have a width and a depth that are equal or similar to those of the deep device isolation portion 13d, and thus, it may be possible to reduce a risk of a process failure.

Thereafter, the gate insulating layer Gox, the transfer gate TG, the floating diffusion region FD, and the lowermost first interlayer insulating layer IL1 may be formed on the first surface 1a of the first substrate 1 (e.g., through a typical process). The first contact plug 17 may be formed to penetrate the lowermost first interlayer insulating layer IL1 and to be in contact with the floating diffusion region FD. The second contact plug 19 may be formed to penetrate the lowermost first interlayer insulating layer IL1 and the gapfill insulating pattern 11 of the penetration structures 13c (e.g., the second gapfill insulating pattern 11b of FIG. 3B) and to be in contact with the conductive pattern 9 of the penetration structures 13c (e.g., the second conductive pattern 9b of FIG. 3B). Next, the first interconnection lines 15 and the other first interlayer insulating layers among the first interlayer insulating layers IL may be formed on the lowermost first interlayer insulating layer IL1. The front-side conductive pad 21 may be formed in the uppermost layer of the first interlayer insulating layers IL4.

Figure 5B:
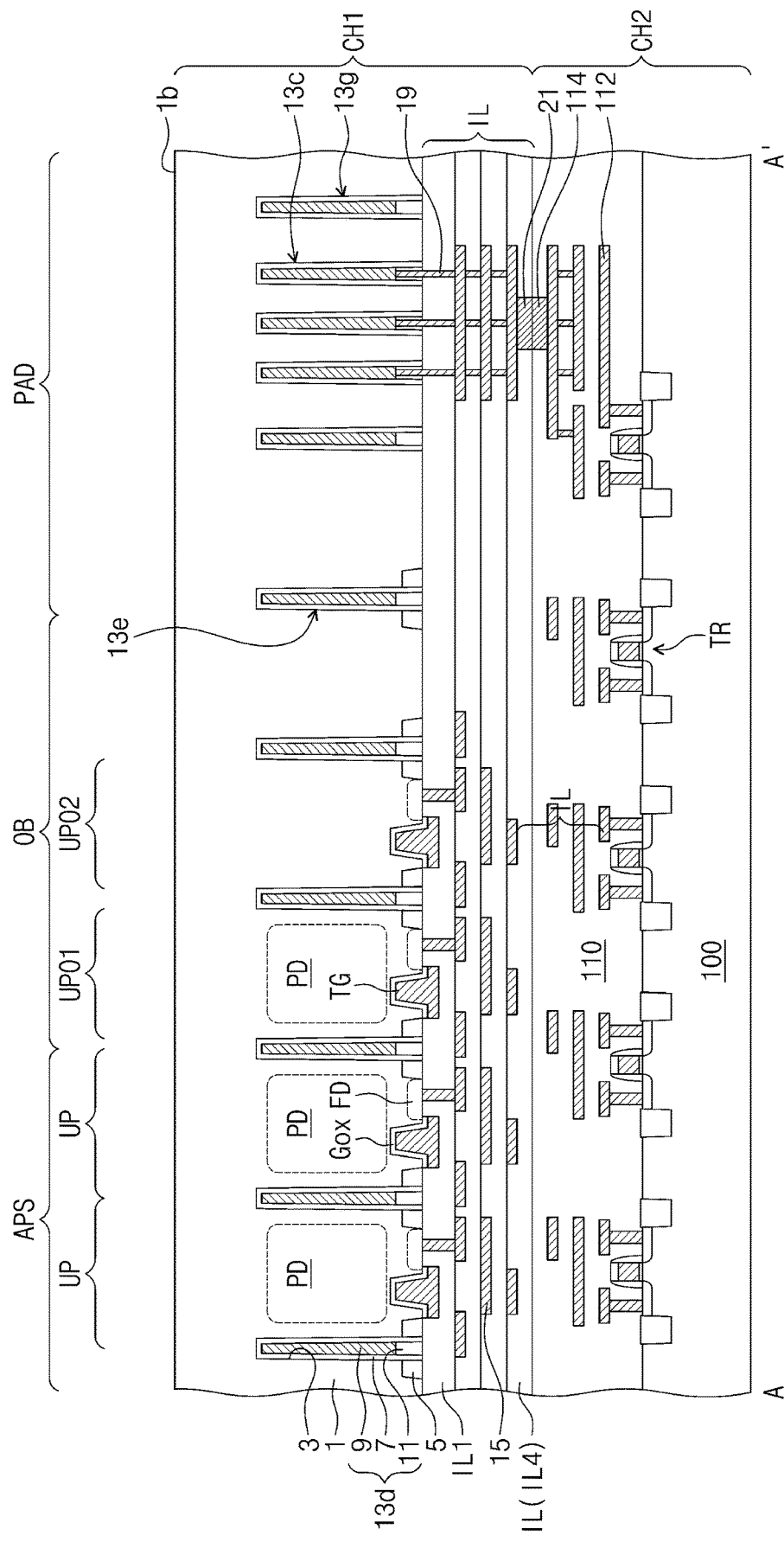

Referring to FIG. 5B, the second sub-chip CH2 having the structure of FIG. 2 may be prepared. The first sub-chip CH1 may be inverted. Next, the first sub-chip CH1 may be placed on the second sub-chip CH2, such that the uppermost first interlayer insulating layer IL4 is in contact with the second interlayer insulating layer 110 and the front-side conductive pad 21 is in contact with the logic conductive pad 114, and then, a thermo-compression process or the like may be performed on the first sub-chip CH1 that is placed on the second sub-chip CH2.

Figure 5C:
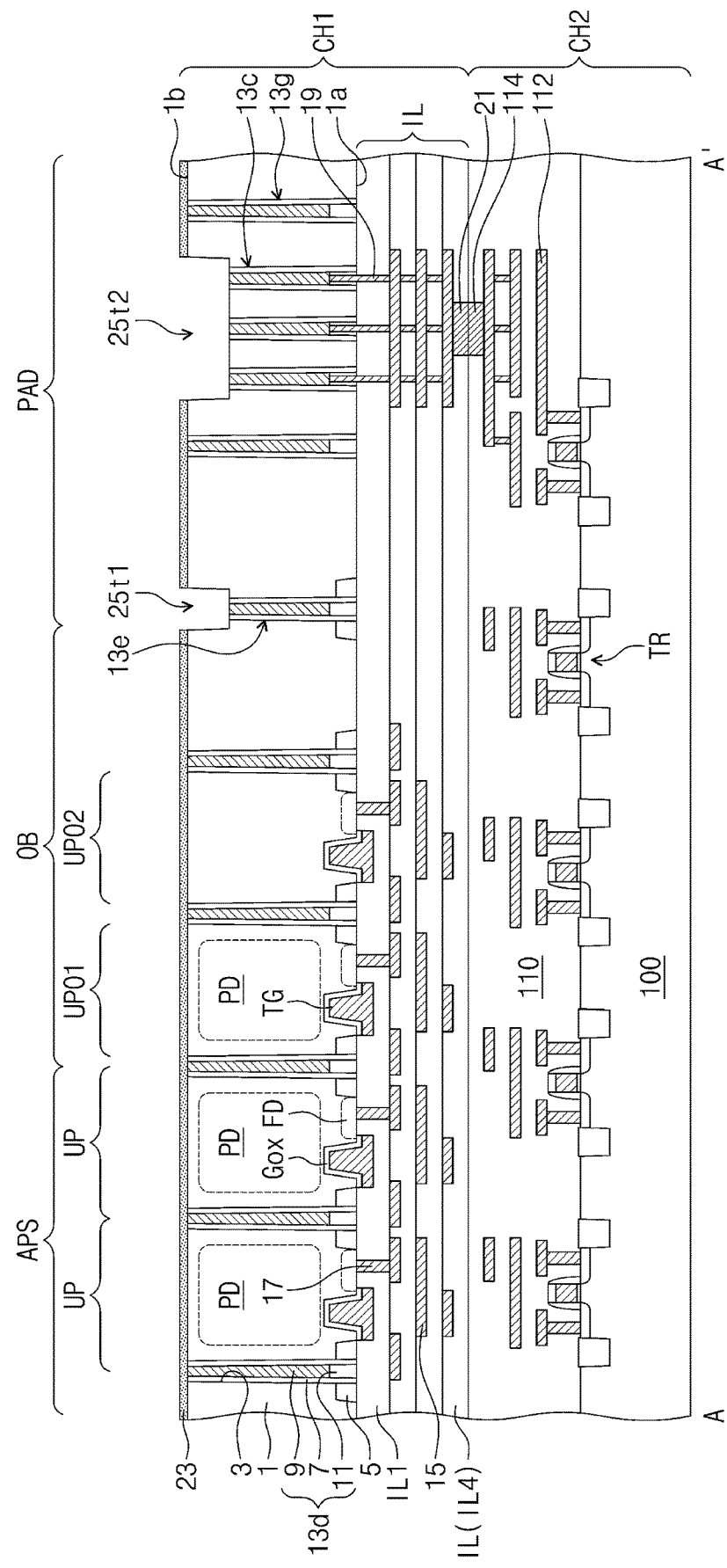

Referring to FIG. 5C, to reduce a thickness of the first substrate 1 to a desired thickness, a grinding process may be performed on the second surface 1b of the first substrate 1, which is in the state of FIG. 5B. At this time, the conductive patterns 9 of the deep device isolation portion 13d, the outermost deep device isolation portion 13e, the penetration structures 13c, and the pad isolation portion 13g may be exposed to the outside. The fixed charge layer 23 may be deposited on the second surface 1b of the first substrate 1. The first recess 25t1 and the second trench 25t2 may be formed by partially etching the fixed charge layer 23, the first substrate 1, the outermost deep device isolation portion 13e, and the penetration structures 13c. Here, the first recess 25t1 may be formed to have a width that is smaller than that of the second trench 25t2. In an embodiment, a plurality of the penetration structures 13c may be formed, and in this case, it may be possible to relieve a physical stress on the first substrate 1, which may occur when the second trench 25t2 is etched.

Figure 5D:
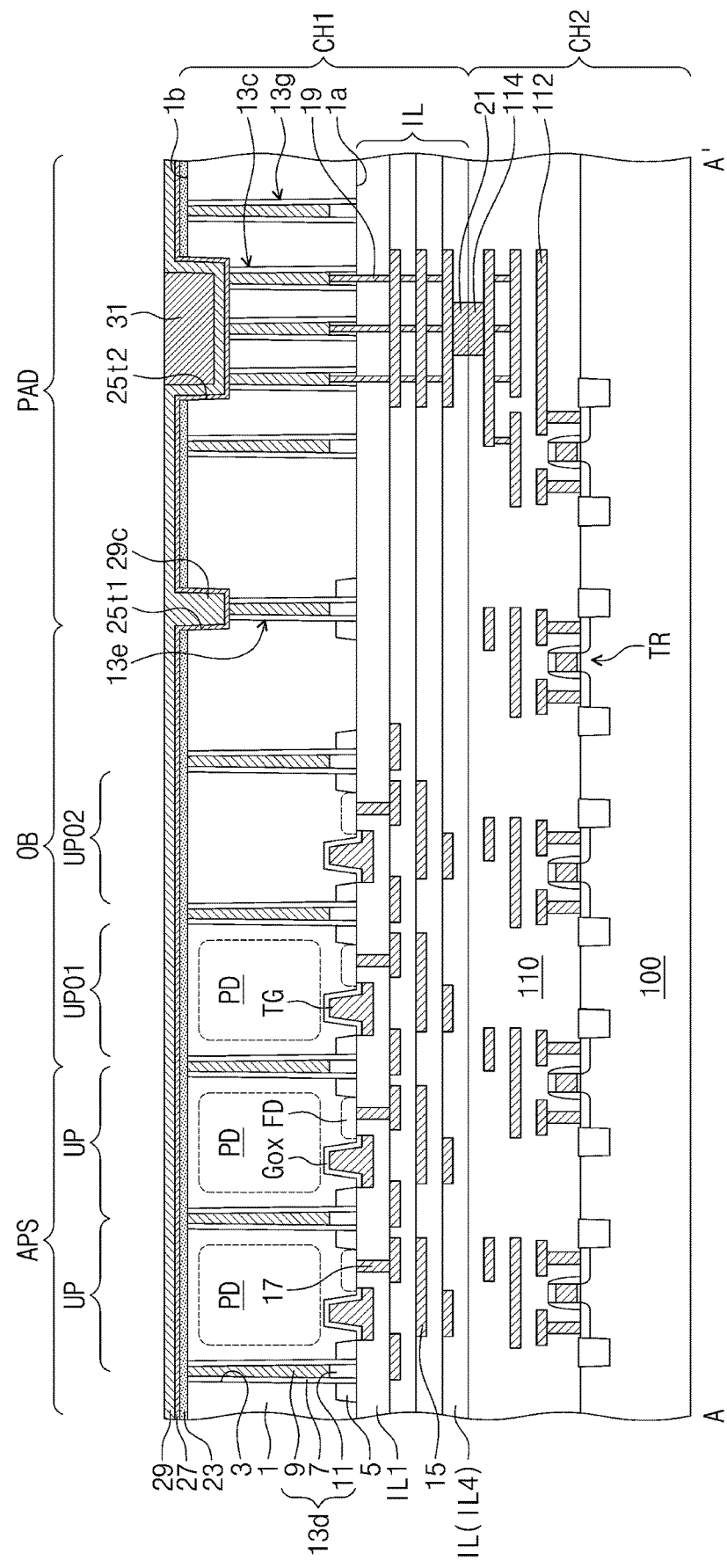

Referring to FIG. 5D, a diffusion barrier layer 27 may be conformally formed on the second surface 1b of the first substrate 1. A first optical black layer 29 may be conformally formed on the diffusion barrier layer 27. Since the first recess 25t1 has a relatively small width, the first recess 25t1 may be filled with the first optical black layer 29, and thus, the first optical black layer 29 may include the bias contact plug 29c filling in the first recess 25t1. The back-side conductive pad 31 may be formed in the second trench 25t2 and on the first optical black layer 29. The back-side conductive pad 31 may be formed by sequentially performing a deposition process and an etching process. Alternatively, an additional mask pattern (not shown) may be formed on the first optical black layer 29, and then, a plating process may be performed to selectively form the back-side conductive pad 31.

Figure 5E:
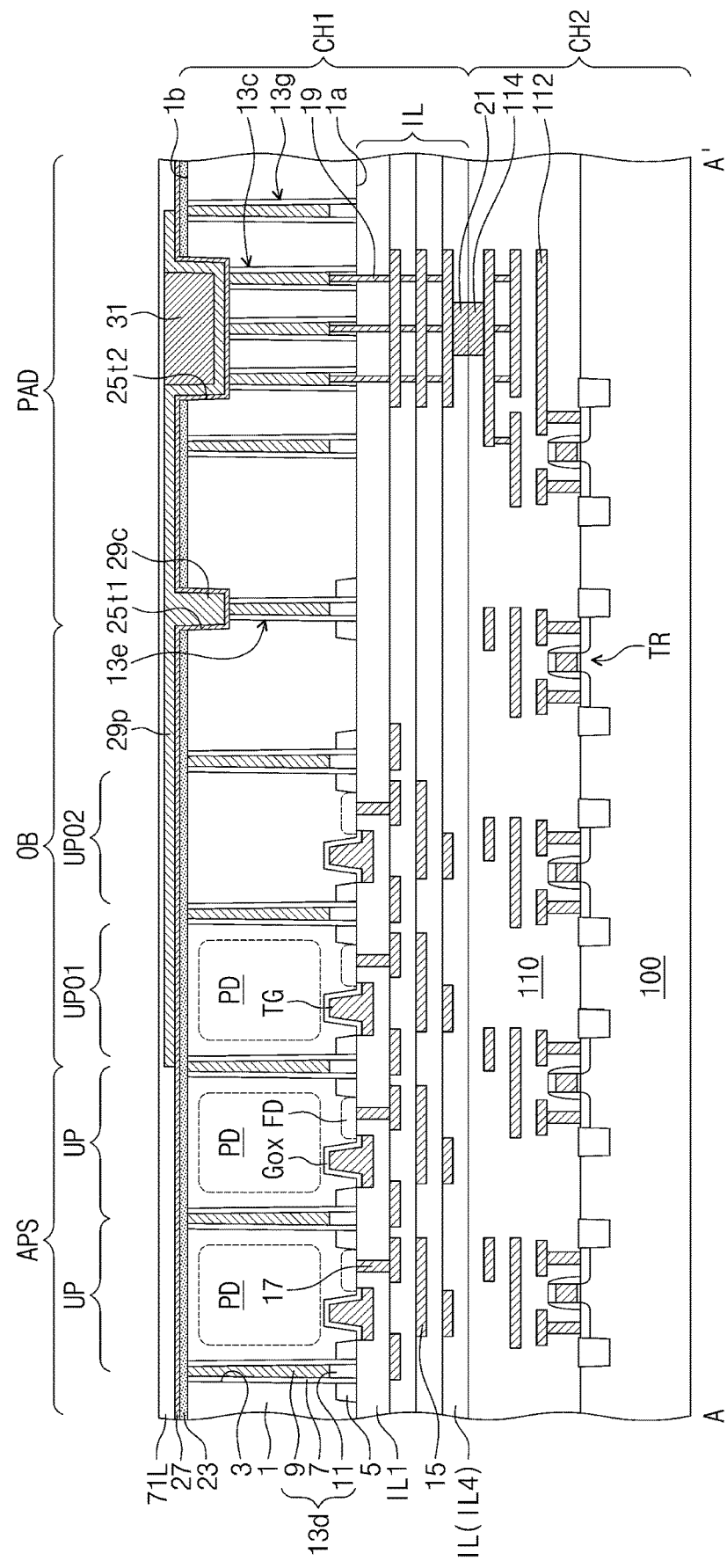

Referring to FIG. 5E, the first optical black layer 29 may be etched to form the first optical black pattern 29p in the optical black region OB and the pad region PAD and to expose the diffusion barrier layer 27 in the pixel region APS. Thereafter, a low refractive layer 71L may be formed on the entire region of the second surface 1b of the first substrate 1. The low refractive layer 71L may be formed by, for example, a spin coating method.

Figure 5F:
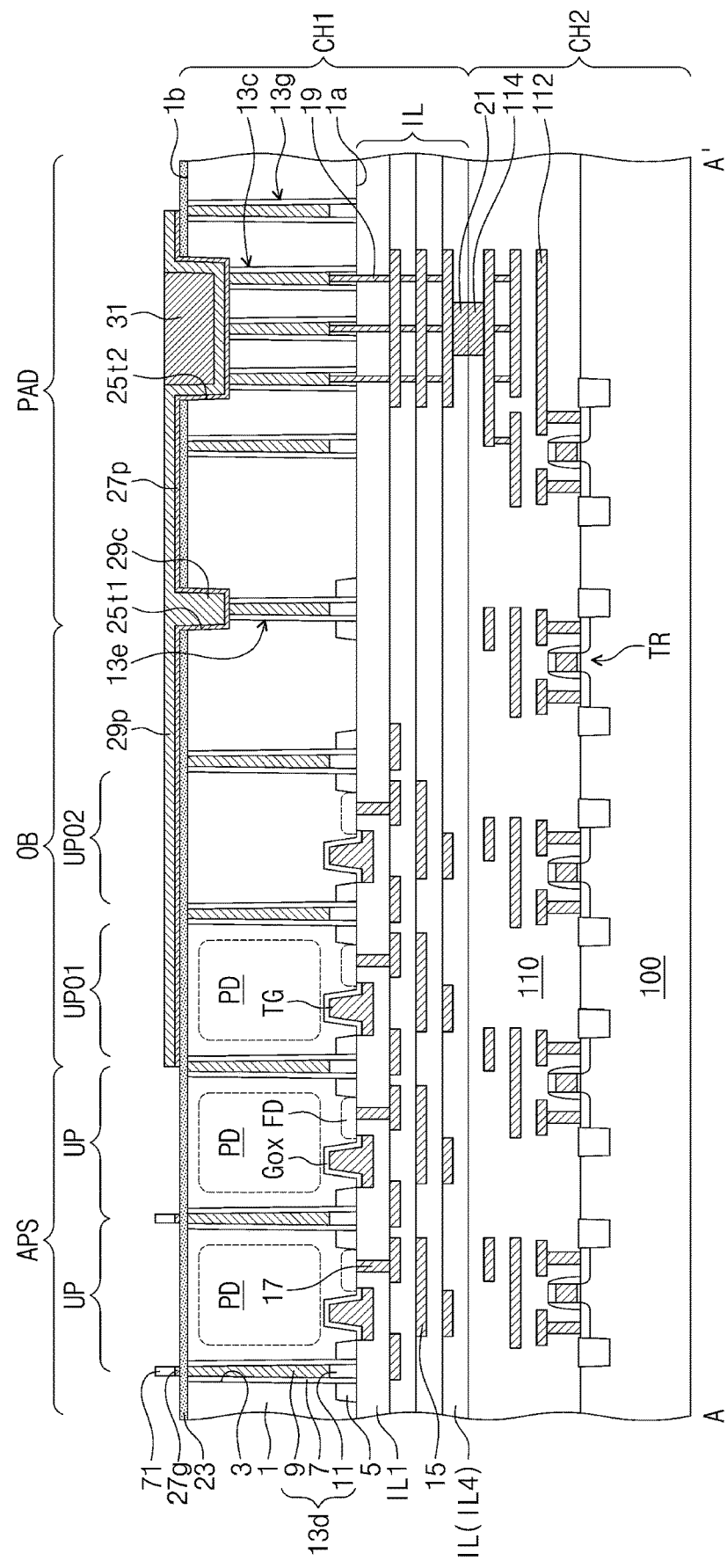

Referring to FIG. 5F, the low refractive pattern 71 and the light-blocking grid pattern 27g may be formed by etching the low refractive layer 71L and the diffusion barrier layer 27 in the pixel region APS. The light-blocking grid pattern 27g may be formed as a part of the diffusion barrier layer 27. The low refractive layer 71L may be completely removed from the optical black region OB and the pad region PAD, and the diffusion prevention pattern 27p may be formed below the first optical black pattern 29p. In addition, the fixed charge layer 23 may be exposed to the outside, near the first optical black pattern 29p.

Next, referring to FIG. 2, the passivation layer 33 may be conformally formed on the entire region of the second surface 1b of the first substrate 1. The color filters CF1 and CF2 and the second optical black pattern CFB may be formed through a typical process. The second optical black pattern CFB may be formed when a blue color filter is formed. Thereafter, the micro lens layer ML may be formed on the color filters CF1 and CF2 and the second optical black pattern CFB. The opening 35 exposing the back-side conductive pad 31 may be formed by etching the micro lens layer ML and the passivation layer 33 in the pad region PAD.

Figure 6:
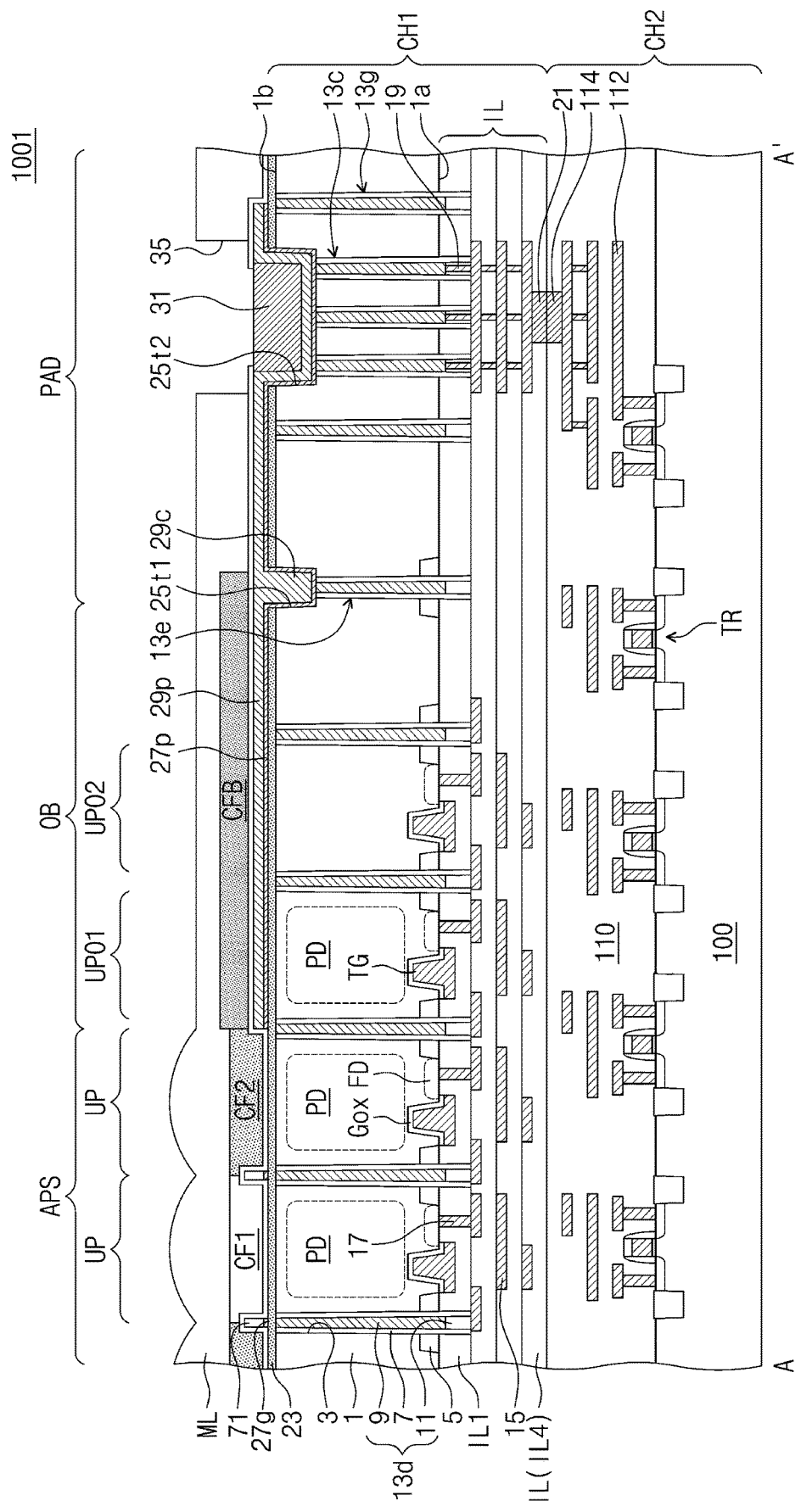
FIG. 6 is a sectional view taken along the line A-A' of FIG. 1 to illustrate a semiconductor device according to an embodiment of the inventive concept.

FIG. 6 is a sectional view taken along the line A-A' of FIG. 1 to illustrate a semiconductor device according to an embodiment of the inventive concept.

Referring to FIG. 6, in an image sensor 1001 according to an embodiment of the inventive concept, the deep device isolation portion 13d, the outermost deep device isolation portion 13e, the pad isolation portion 13g, and the penetration structures 13c may penetrate the lowermost first interlayer insulating layer IL1 and the first substrate 1. The deep device isolation portion 13d, the outermost deep device isolation portion 13e, the pad isolation portion 13g, and the penetration structures 13c may have bottom surfaces that are coplanar with a surface of the lowermost first interlayer insulating layer ILL In the present embodiment, the deep device isolation portion 13d may be in contact with at least one of the first interconnection lines 15. However, the conductive pattern 9 of the deep device isolation portion 13d may be electrically disconnected from the first interconnection lines 15 by the gapfill insulating pattern 11. The second contact plug 19 may penetrate only the gapfill insulating pattern 11 of the penetration structures 13c without penetrating the lowermost first interlayer insulating layer IL1. Except for the afore-described differences, the image sensor 1001 may have substantially the same features as that described with reference to FIGS. 1, 2, 3A, and 3B. In the image sensor 1001 according to an embodiment of the inventive concept, since the deep device isolation portion 13d protrudes out of the first surface 1a of the first substrate 1 and is in contact with the first interconnection lines 15, it may be possible to prevent a cross-talk issue, which occurs when light reflected by the surface of the first interconnection lines 15 is incident on neighboring pixels. Accordingly, it may be possible to provide an image sensor capable of realizing a clear image.

Figure 7:
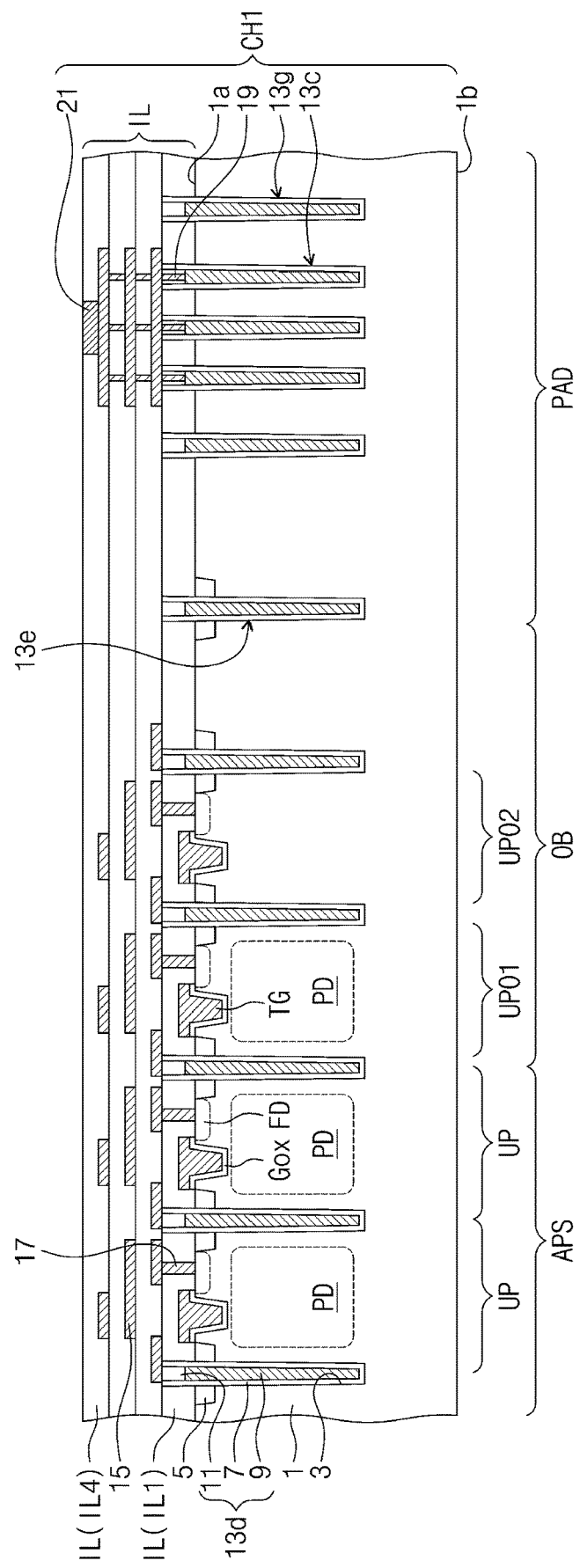
FIG. 7 is a sectional view illustrating a process of fabricating the image sensor of FIG. 6.

FIG. 7 is a sectional view illustrating a process of fabricating the image sensor of FIG. 6.

Referring to FIG. 7, an ion implantation process or the like may be performed on the first substrate 1 including the pixel region APS, the optical black region OB, and the pad region PAD to form the photoelectric conversion part PD. The shallow device isolation portion 5 may be formed in the first surface 1a of the first substrate 1 to define active regions. The shallow device isolation portion 5 may be formed by a shallow trench isolation (STI) process. The gate insulating layer Gox, the transfer gate TG, the floating diffusion region FD, and the lowermost first interlayer insulating layer IL1 may be formed on the first surface 1a of the first substrate 1 (e.g., through a typical process). Thereafter, the deep trenches 3 may be formed by etching the lowermost first interlayer insulating layer ILL the shallow device isolation portion 5, and a portion of the first substrate 1. The deep device isolation portion 13d, the outermost deep device isolation portion 13e, the penetration structures 13c, and the pad isolation portion 13g may be formed by forming the isolation insulating layer 7, the conductive pattern 9, and the gapfill insulating pattern 11 in the deep trenches 3. Next, the first interconnection lines 15 and the first interlayer insulating layers IL may be formed on the lowermost first interlayer insulating layer ILL The front-side conductive pad 21 may be formed in the uppermost first interlayer insulating layer IL4. Thereafter, subsequent processes may be performed in the same manner as those described with reference to FIGS. 5B to 5F.

Figure 8:
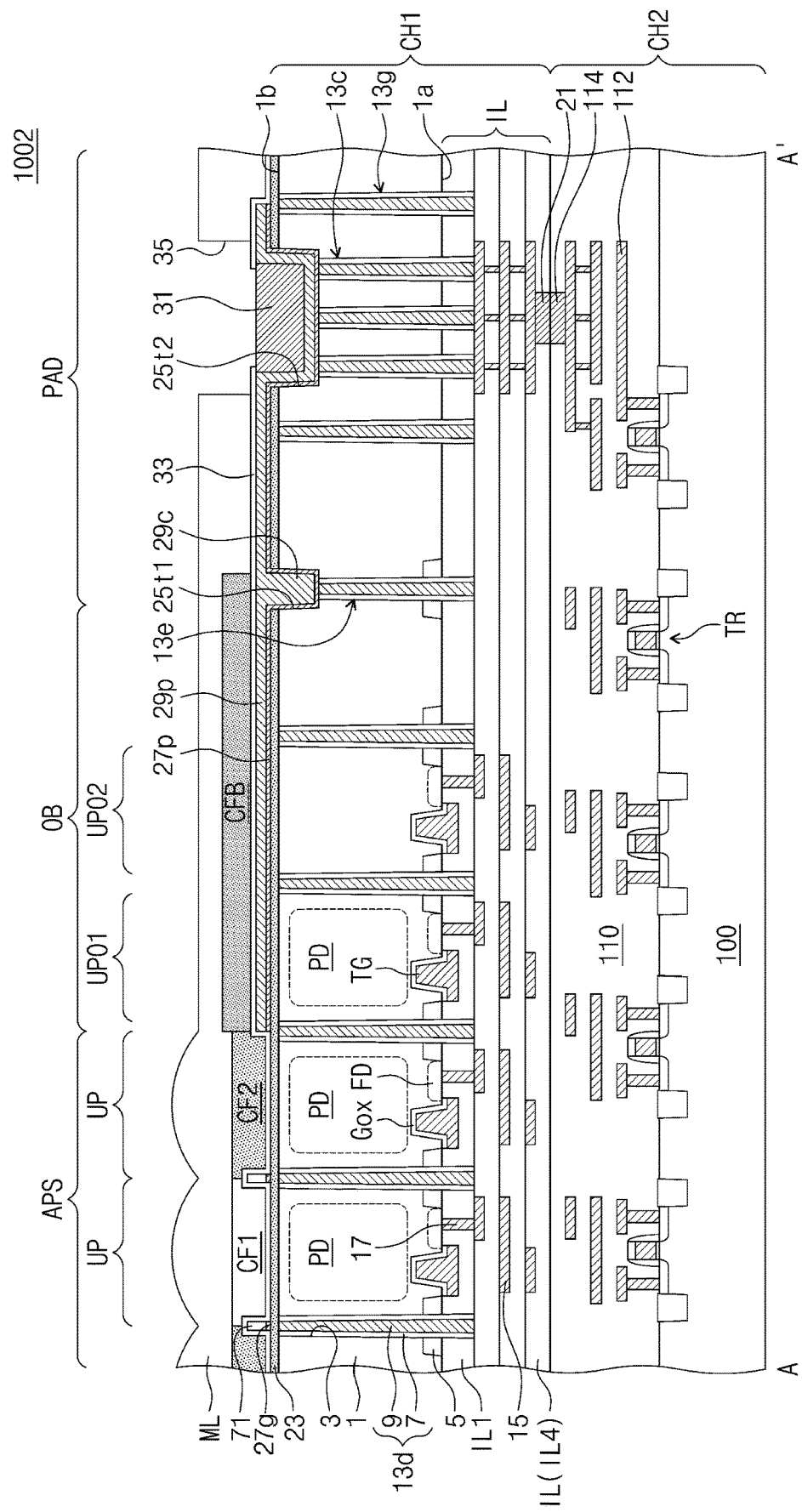
FIG. 8 is a sectional view taken along the line A-A' of FIG. 1 to illustrate a semiconductor device according to an embodiment of the inventive concept.

FIG. 8 is a sectional view taken along the line A-A' of FIG. 1 to illustrate a semiconductor device according to an embodiment of the inventive concept.

Referring to FIG. 8, in an image sensor 1002 according to an embodiment of the inventive concept, the deep device isolation portion 13d, the outermost deep device isolation portion 13e, the penetration structures 13c, and the pad isolation portion 13g does not include the gapfill insulating pattern 11. The conductive patterns 9 of the deep device isolation portion 13d, the outermost deep device isolation portion 13e, the penetration structures 13c, and the pad isolation portion 13g may be coplanar with a surface of the lowermost first interlayer insulating layer ILL The deep device isolation portion 13d, the outermost deep device isolation portion 13e, and the pad isolation portion 13g is not in contact with the first interconnection lines 15. The conductive pattern 9 of the penetration structures 13c may be in contact with the first interconnection lines 15. The image sensor 1002 according to an embodiment of the inventive concept does not include the second contact plug 19 of FIG. 6. Accordingly, the penetration structures 13c may electrically connect the back-side conductive pad 31 to at least one of the first interconnection lines 15 without the second contact plug 19 of FIG. 6. Except for the afore-described differences, the image sensor 1002 may have substantially the same features as that described with reference to FIG. 6.

Figure 9:
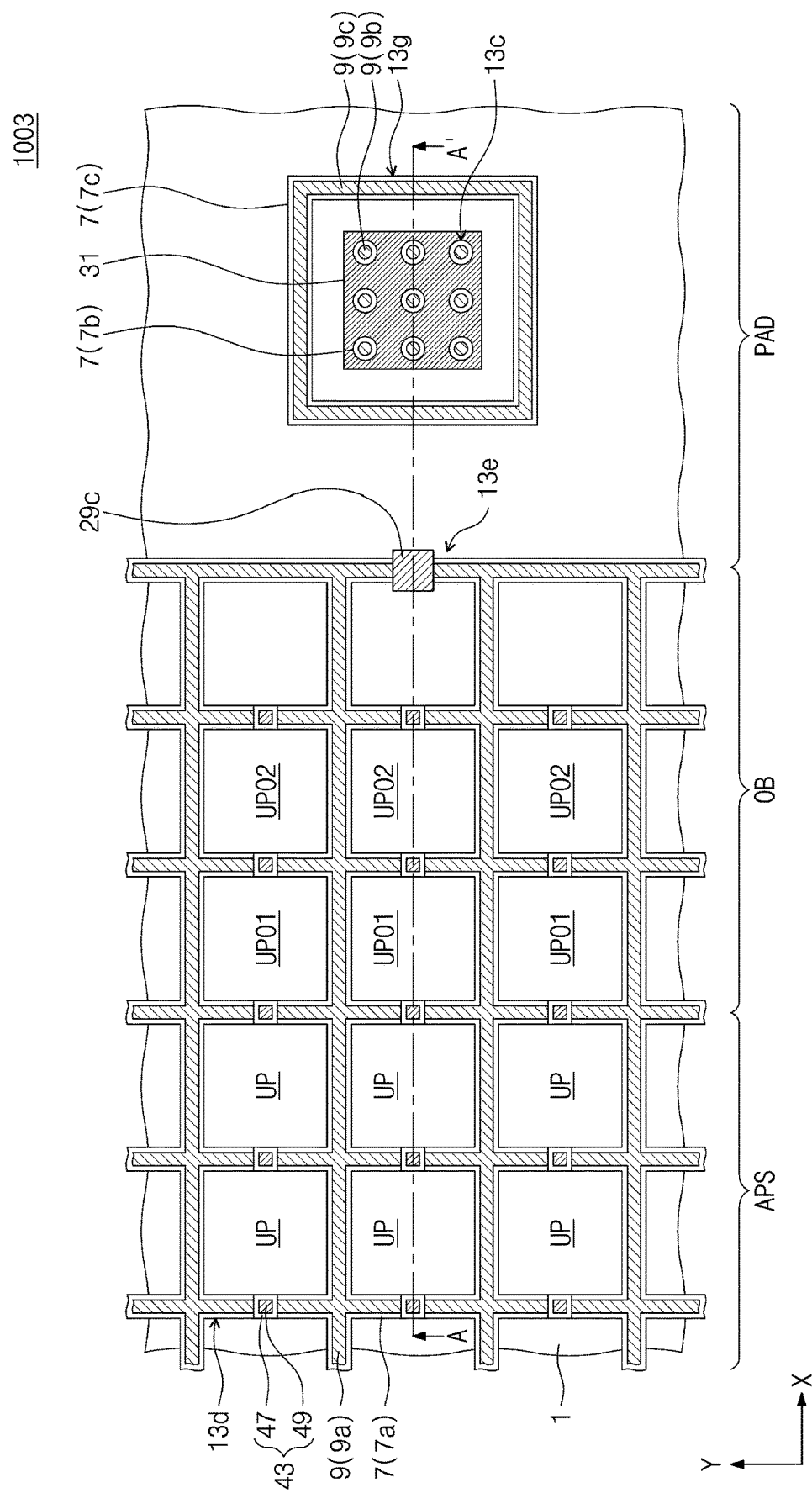
FIG. 9 is a plan view illustrating a semiconductor device according to an embodiment of the inventive concept.
Figure 10:
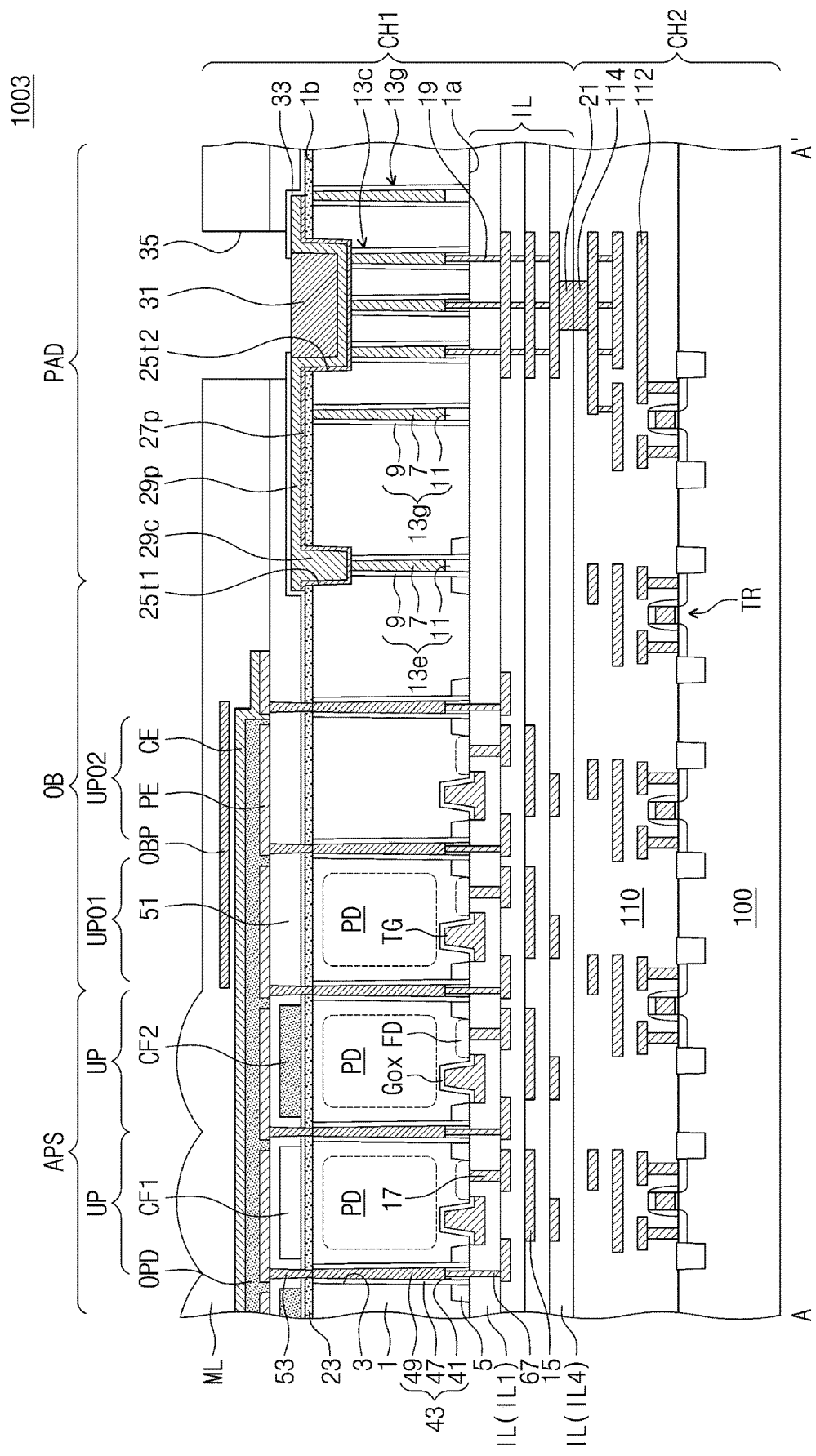
FIG. 10 is a sectional view taken along line A-A' of FIG. 9 to illustrate a semiconductor device according to an embodiment of the inventive concept.

FIG. 9 is a plan view illustrating a semiconductor device according to an embodiment of the inventive concept. FIG. 10 is a sectional view taken along line A-A' of FIG. 9 to illustrate a semiconductor device according to an embodiment of the inventive concept.

Referring to FIGS. 9 and 10, an image sensor 1003 according to an embodiment of the inventive concept may be an example of an organic CMOS image sensor. When viewed in a plan view, a second penetration structure 43 may be disposed between the unit pixels UP. The second penetration structure 43 between adjacent ones of the unit pixels UP may penetrate the deep device isolation portion 13d and to divide the deep device isolation portion 13d into two portions. The second penetration structure 43 may include a penetration conductive pattern 49, a penetration gapfill insulating pattern 41 interposed between the penetration conductive pattern 49 and the lowermost first interlayer insulating layer IL1, and a penetration isolation insulating layer 47 enclosing side surfaces of the penetration conductive pattern 49 and the penetration gapfill insulating pattern 41. The penetration isolation insulating layer 47 may electrically disconnect the penetration conductive pattern 49 from the conductive pattern 9 of the deep device isolation portion 13d. The penetration conductive pattern 49 may be formed of or include a material that is different from or the same as the conductive patterns 9 of the deep device isolation portion 13d, the outermost deep device isolation portion 13e, the pad isolation portion 13g, and the penetration structures 13c. A third contact plug 67 may penetrate the lowermost first interlayer insulating layer IL1 and the penetration gapfill insulating pattern 41 and to connect the penetration conductive pattern 49 to at least one of the first interconnection lines 15.

The first optical black pattern 29p does not cover the optical black region OB. The color filters CF1 and CF2 may be disposed on the passivation layer 33 and in the pixel region APS. In the present embodiment, each of the color filters CF1 and CF2 may be blue or red. The color filters CF1 and CF2 and the passivation layer 33 may be covered with a planarization layer 51. In the pixel region APS and the optical black region OB, pixel electrodes PE may be disposed on the planarization layer 51 to be spaced apart from each other. A fourth contact plug 53 may penetrate the planarization layer 51 and to connect the pixel electrodes PE to the penetration conductive pattern 49. The planarization layer 51 may be formed of or include at least one of silicon oxide and silicon nitride. The pixel electrodes PE may be covered with an organic photoelectric conversion layer OPD. The organic photoelectric conversion layer OPD may include a p-type organic semiconductor material and an n-type organic semiconductor material, which form a pn junction. Alternatively, the organic photoelectric conversion layer OPD may include at least one of quantum dots and chalcogenide materials. The organic photoelectric conversion layer OPD may be configured to execute a photoelectric conversion process on light of specific color (e.g., green). A common electrode CE may be disposed on the organic photoelectric conversion layer OPD. The pixel electrodes PE and the common electrode CE may be formed of or include at least one of indium tin oxide (ITO), indium zinc oxide (IZO), zinc oxide (ZnO), and an organic transparent conductive material.

The micro lens layer ML may be disposed on the common electrode CE. In the optical black region OB, a second optical black pattern OBP may be disposed in the micro lens layer ML. The second optical black pattern OBP may be formed of or include, for example, an opaque metal (e.g., aluminum). Except for the afore-described differences, the image sensor 1003 may have substantially the same features as that described with reference to FIGS. 1, 2, 3A, and 3B. Since the image sensor 1003 according to an embodiment of the inventive concept includes the organic photoelectric conversion layer OPD, each unit pixel UP may sense lights of two different colors at the same time.

According to an embodiment of the inventive concept, an image sensor may include a plurality of penetration structures connecting a back-side conductive pad to first interconnection lines, and in this case, it may be possible to reduce a process failure and to prevent physical, mechanical, or thermal stress from being concentrated on a specific region. This may make it possible to improve reliability of the image sensor.

While example embodiments of the inventive concept have been particularly shown and described, it will be understood by one of ordinary skill in the art that variations in form and detail may be made therein without departing from the spirit and scope of the attached claims.

What is claimed is:

1. An image sensor, comprising:
a substrate including a pixel region and a pad region and having a first surface and a second surface opposite to the first surface, wherein the pixel region of the substrate is provided with a plurality of unit pixels;
a first recess provided in the pad region of the substrate, wherein the first recess is recessed to a first depth from the second surface toward the first surface, and wherein a bottom surface of the first recess is lower than the second surface of the substrate;
an interlayer insulating layer disposed on the first surface;
an interconnection line disposed in the interlayer insulating layer;
a conductive pad disposed in the first recess of the pad region;
a plurality of penetration structures disposed in the pad region of the substrate and extending from the bottom surface of the first recess to the first surface of the substrate, and electrically connecting the conductive pad to the interconnection line; and
a deep device isolation structure disposed in the pixel region of the substrate, and extending from the second surface of the substrate to the first surface of the substrate to separate two adjacent unit pixels of the plurality of unit pixels from each other, wherein an upper surface of the deep device isolation structure is higher than an upper surface of each penetration structure of the plurality of penetration structures.

2. The image sensor of claim 1,
wherein the deep device isolation structure comprises a first conductive pattern extending from the second surface of the substrate toward the first surface of the substrate and a first isolation insulating layer extending along a sidewall of the first conductive pattern from the second surface of the substrate toward the first surface of the substrate,
wherein each of the plurality of penetration structures comprises a second conductive pattern extending from the bottom surface of the first recess toward the first surface of the substrate, and a second isolation insulating layer extending along a sidewall of the second conductive pattern from the bottom surface of the first recess toward the first surface of the substrate,
wherein the first conductive pattern comprises the same material as the second conductive pattern, and
wherein the first isolation insulating layer comprises the same material as the second isolation insulating layer.

3. The image sensor of claim 2,
wherein each of the first conductive pattern and the second conductive pattern comprises polysilicon doped with an impurity at the same doping concentration.

4. The image sensor of claim 2,
wherein the deep device isolation structure further comprises a first gapfill insulating pattern, which is interposed between a bottom surface of the first conductive pattern and the interlayer insulating layer,
wherein the first isolation insulating layer further extends along a sidewall of the first gapfill insulating pattern to the first surface of the substrate,
wherein each of the plurality of penetration structures further comprises a second gapfill insulating pattern, which is interposed between a bottom surface of the second conductive pattern and the interlayer insulating layer,
wherein the second isolation insulating layer further extends along a sidewall of the second gapfill insulating pattern to the first surface of the substrate, and
wherein the first gapfill insulating pattern comprises the same material as the second gapfill insulating pattern.

5. The image sensor of claim 4, further comprising:
a plurality of first contact plugs disposed in the pad region of the substrate,
wherein each of the plurality of first contact plugs is connected to a corresponding one of the plurality of penetration structures, and
wherein each of the plurality of first contact plugs penetrates a second gapfill insulating pattern of a corresponding one of the plurality of penetration structures to contact a bottom surface of a second conductive pattern of the corresponding one of the plurality of penetration structures.

6. The image sensor of claim 2,
wherein the deep device isolation structure has a first width, when measured at a first height from the first surface of the substrate and in a first direction which is parallel to the first surface of the substrate,
wherein each of the plurality of penetration structures has a second width, when measured at the first height and in the first direction, and
wherein the second width is equal to or larger than the first width.

7. The image sensor of claim 2, further comprising:
a closed-loop pad isolation structure disposed in the pad region of the substrate and extending from the second surface of the substrate to the first surface of the substrate,
wherein the plurality of penetration structures and the conductive pad are disposed in the inside of the closed-loop pad isolation structure,
wherein the closed-loop pad isolation structure comprises a third conductive pattern extending from the second surface of the substrate toward the first surface of the substrate, and a third isolation insulating layer extending along a sidewall of the third conductive pattern from the second surface of the substrate toward the first surface of the substrate,
wherein the third conductive pattern comprises the same material as the second conductive pattern, and wherein the third isolation insulating layer comprises the same material as the second isolation insulating layer.

8. The image sensor of claim 2, further comprising:
a bias contact plug disposed in a second recess which is provided with the substrate,
wherein the second recess is recessed to a second depth from the second surface of the substrate toward the first surface of the substrate.

9. The image sensor of claim 8,
wherein when the image sensor is viewed in a plan view, the first conductive pattern of the deep device isolation structure has a mesh shape, and is in contact with a sidewall of the bias contact plug which is disposed in the second recess.

10. The image sensor of claim 8, further comprising:
a first optical black pattern disposed on the pad region of the substrate, and an optical black region of the substrate between the pixel region of the substrate and the pad region of the substrate, wherein the first optical black pattern is connected to the bias contact plug in the second recess and the conductive pad in the first recess; and
a second optical black pattern on the optical black region,
wherein the first optical black pattern is disposed between the optical black region and the second optical black pattern, and
wherein the first optical black pattern comprises the same material as the bias contact plug.

11. The image sensor of claim 1,
wherein each of the plurality of penetration structures extends beyond the first surface of the substrate.

12. The image sensor of claim 1,
wherein the deep device isolation structure extends from the second surface of the substrate beyond the first surface of the substrate to separate the plurality of unit pixels from each other.

13. The image sensor of claim 1,
wherein the plurality of penetration structures are connected to each other to form a mesh structure.

14. An image sensor, comprising:
a substrate including a pixel region and a pad region and having a first surface and a second surface opposite to the first surface, wherein the pixel region of the substrate is provided with a plurality of unit pixels;
a first recess provided in the pad region of the substrate, wherein the first recess is recessed to a first depth from the second surface toward the first surface, and wherein a bottom surface of the first recess is lower than the second surface of the substrate;
a deep device isolation structure disposed in the pixel region of the substrate to separate the plurality of unit pixels from each other and extending from the second surface of the substrate to the first surface of the substrate;
wherein each of the plurality of unit pixels includes a photoelectric conversion part disposed in the substrate and a transfer gate disposed on the first surface of the substrate;
an interlayer insulating layer disposed on the first surface of the substrate;
an interconnection line disposed in the interlayer insulating layer;
a conductive pad disposed in the first recess of the pad region of the substrate; and
a plurality of penetration structures disposed in the pad region of the substrate,
wherein the plurality of penetration structures extend from the bottom surface of the first recess to the first surface of the substrate, are overlapped with the conductive pad, and electrically connect the conductive pad to the interconnection line,
wherein the deep device isolation structure has a first width,
wherein each of the plurality of penetration structures has a second width, and
wherein the second width is 1.0-2.0 times the first width.

15. The image sensor of claim 14,
wherein the plurality of penetration structures extend beyond the first surface of the substrate.

16. The image sensor of claim 14,
wherein the deep device isolation structure extends from the second surface of the substrate beyond the first surface of the substrate.

17. An image sensor, comprising:
a substrate including a pixel region and a pad region and having a first surface and a second surface opposite to the first surface, wherein the pad region of the substrate is provided with a first recess which is recessed to a first depth from the second surface toward the first surface and the pixel region of the substrate is provided with a plurality of unit pixels;
a deep device isolation structure disposed in the pixel region of the substrate to separate the plurality of unit pixels from each other and extending from the first surface to the second surface;
an interlayer insulating layer disposed on the first surface;
an interconnection line disposed in the interlayer insulating layer;
a conductive pad disposed in the first recess of the pad region; and
a plurality of penetration structures disposed in the pad region of the substrate,
wherein the plurality of penetration structures extend from a bottom surface of the first recess to the first surface of the substrate, are overlapped with the conductive pad, and electrically connect the conductive pad to the interconnection line,
wherein the deep device isolation structure has a first height,
wherein each of the plurality of penetration structures has a second height, and
wherein the second height is smaller than the first height.

18. The image sensor of claim 17,
wherein the plurality of penetration structures extend beyond the first surface of the substrate.

19. The image sensor of claim 17,
wherein the deep device isolation structure extends from the second surface of the substrate beyond the first surface of the substrate.

20. The image sensor of claim 17,
wherein the plurality of penetration structures are connected to each other to form a mesh structure.

* * * * *